United States Patent [19]

Ando et al.

[11] Patent Number: 5,761,223
[45] Date of Patent: Jun. 2, 1998

[54] ERROR CORRECTING DEVICE

[75] Inventors: Kazuhiro Ando, Katano; Hiroyuki Imai, Takarazuka; Takayuki Suematsu; Shinichiro Ohmi, both of Osaka, all of Japan

[73] Assignee: Matsushita Electric Industrial Co., Ltd., Osaka, Japan

[21] Appl. No.: 504,740

[22] Filed: Jul. 20, 1995

[30] Foreign Application Priority Data

Jul. 21, 1994 [JP] Japan ................. 6-169831

[51] Int. Cl.$^6$ ................................. H03M 13/00
[52] U.S. Cl. ................................. 371/41
[58] Field of Search ................................. 371/41

[56] References Cited

U.S. PATENT DOCUMENTS

| | | | |
|---|---|---|---|
| 3,078,443 | 2/1963 | Rose | 371/41 |
| 3,534,264 | 10/1970 | Blasbalg et al. | 375/285 |
| 4,047,151 | 9/1977 | Rydbeck et al. | 371/41 |
| 4,189,748 | 2/1980 | Reis | 348/404 |
| 4,357,700 | 11/1982 | Alvarez, III et al. | 370/317 |
| 4,638,476 | 1/1987 | Acampora et al. | 370/421 |
| 5,128,942 | 7/1992 | Kojima | 371/5.5 |
| 5,159,447 | 10/1992 | Haskell et al. | 348/419 |
| 5,452,103 | 9/1995 | Brusewitz | 358/261.2 |
| 5,590,405 | 12/1996 | Daly et al. | 455/54.1 |

FOREIGN PATENT DOCUMENTS

| | | |
|---|---|---|
| 0188271 | 7/1986 | European Pat. Off. |
| 0423485 | 4/1991 | European Pat. Off. |
| 2160392 | 12/1985 | United Kingdom. |
| 2196516 | 4/1988 | United Kingdom. |
| 2253546 | 9/1992 | United Kingdom. |

*Primary Examiner*—Stephen M. Baker
*Attorney, Agent, or Firm*—Ratner & Prestia

[57] ABSTRACT

A device consists of: a first unit which divides voice and image data into blocks each consisting of a predetermined number of data, and executes a method of selecting one of plural error correction encoding systems and conducting encoding on an arbitrary number of data in one block; a second unit which executes a method of measuring an error state of a communication channel; and a third unit which executes a method of determining data which are to be subjected to encoding conducted in the first unit, and an error correction encoding system. When the state of the communication channel is inferior, only data of high importance can be protected. When the state is superior, a wide range of data including those of low importance can be protected.

25 Claims, 4 Drawing Sheets

ERROR CORRECTING DEVICE

BACKGROUND OF THE INVENTION

1. Field of the Invention

The invention relates to an error correcting device for voice and image data in a real time radio communication system.

2. Related Art of the Invention

Generally, in a real time radio communication system for voice and image data, transmitted data are protected using error correction codes to prevent sound and picture quality from being degraded by an error in a communication channel.

FIG. 4 shows the configuration of a prior art error correcting device. In FIG. 4, 30 designates an error correction encoding unit, 31 designates a modulator, 32 designates a demodulator, and 33 designates an error correction decoding unit. The modulator 31, and the demodulator 32 are connected to each other via a communication line. The operation of this error correcting device is described below.

In the sending side, voice and image data are divided into blocks each consisting of a predetermined number of data. The error correction encoding unit 30 conducts a predetermined calculation on each block to add a check bit to the block. The data are modulated by the modulator 31, and then transmitted.

In the receiving side, the data are demodulated by the demodulator 32, and then subjected to a predetermined calculation by the error correction decoding unit 33 to obtain an error pattern, thereby correcting errors.

In the above-mentioned configuration, a fixed error correction is conducted irrespective of the importance of the data. The sound and picture quality are largely degraded when the state of the communication channel is impaired and the error frequency exceeds the error correction ability of the configuration.

Generally, there is a tradeoff relationship between the error correction ability and the information transmission efficiency. When the error correction ability is set to be high for the case where the state of the communication channel is poor, the information transmission efficiency is lowered. This produces a problem in that, even when such a high error correction ability is provided, a radio communication system having a limited communication channel capacity is inefficient.

The invention has been developed in view of such circumstances. It is an object of the invention to provide an error correction device which enables communication of reduced degradation to be conducted even in a communication line of an inferior state, while maintaining constant information transmission efficiency.

SUMMARY OF THE INVENTION

The device according to an exemplary embodiment of the invention comprises: a first unit which (1) divides voice and/or image data into blocks each consisting of a predetermined number of data, (2) selects one of a plurality of error correction encoding systems, and (3) conducts encoding on an arbitrary number of data in one block; a second unit which measures an error state of a communication channel; and a third unit which determines (1) data which are to be subjected to encoding conducted in the first unit, and (2) an error correction encoding system. The second unit supplies information of the measured error state to the third unit. The third unit (1) determines the data which are to be subjected to encoding, and the error correction encoding system, using the error state information, and (2) supplies the determination to the first unit as control information.

The invention is also directed to a device that includes a first unit which selects one of a plurality of error correction encoding systems using control information. The first unit conducts encoding using the selected error correction encoding system on an arbitrary number of data in one of the blocks into which voice and/or image data are divided. Each block has a predetermined number of data. Also included is a second unit which measures an error state of a communication channel and a third unit which determines data which are to be subjected to encoding conducted by the first unit, and an error correction encoding system. The second unit supplies information of the measured error state to the third unit. The third unit determines the data which are to be subjected to encoding and the error correction encoding system using the error state information and supplies the determination to the first unit as the control information.

The invention is also directed to a device that includes a first unit which conducts encoding using a plurality of error correction encoding systems respectively on an arbitrary number of data in one of the blocks into which voice and/or image data are divided. Each block has a predetermined number of data. The first unit also selects a certain encoded data corresponding to a certain error correction encoding system on a basis of control information. Also included is a second unit which measures an error state of a communication encoding system and a third unit which determines data which are to be subjected to encoding conducted in the first unit, and an error correction encoding system. The second unit supplies information of the measured error state to the third unit. The third unit determines the data which are to be subjected to encoding and the error correction encoding system, using the error state information. The third also supplies the determination to the first unit as the control information.

The device also includes a fourth unit which has a plurality of error correction decoding systems each one of which corresponds to the error correction encoding systems. The fourth unit selects the error correction decoding system corresponding to the error correction encoding system determined by the third unit out of the plurality of error correction decoding systems and conducts decoding on data encoded by said first unit. The second unit measures an error state of a communication channel, and in accordance with the measurement result, the third unit selects an error correction encoding system which is suitable for the error state.

In the selection of the error correction encoding system, it is contemplated that all data may be always handled as protection objects subjected to encoding. It is also contemplated that the correcting codes are variable. Generally, however, there is a tradeoff relationship between the error correction ability and the information transmission efficiency. In other words, when the error correction ability is raised, the information transmission efficiency is lowered. In a system having a fixed communication channel capacity, therefore, the effective information transmission rate is lowered so that it is difficult to conduct communication in real time.

The invention utilizes the property of voice or image data that, even when errors occur in data of low importance, quality degradation of data is low in magnitude as long as data of high importance are free from errors. According to the invention, therefore, degradation of sound and picture quality can be made low in magnitude by changing the encoding system while maintaining a constant information transmission efficiency.

When the state of the communication channel is inferior to a predetermined reference, the number of data in a block which are to be subjected to encoding is decreased by the first unit so that only data of high importance are protected from errors, whereby degradation of sound and picture quality can be very low in magnitude.

In contrast, when the state of the communication channel is superior to a predetermined reference, the number of data in a block which are subjected to encoding is increased by the first unit. As a result, errors are prevented in a wide range of date including those of low importance.

Figure 1:
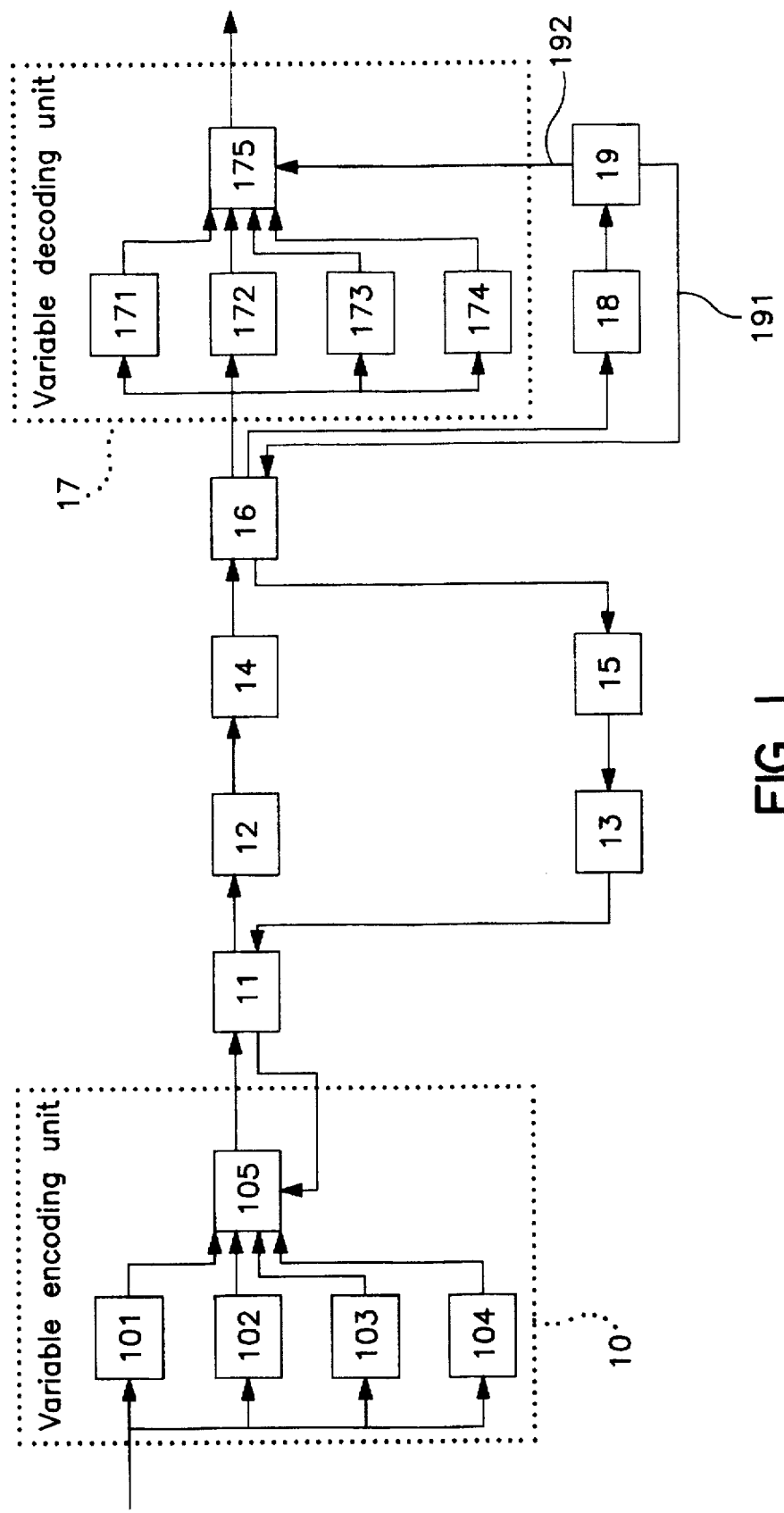
FIG. 1 is a block diagram showing the configuration of an embodiment of the invention.

DESCRIPTION OF REFERENCE NUMERALS 10 variable encoding unit
101 first encoder
102 second encoder
103 third encoder
104 fourth encoder
105 selector
11 packet handler
12 modulator
13 demodulator
14 demodulator
15 modulator
16 packet handler
17 variable decoding unit
171 first decoder
172 second decoder
173 third decoder
174 fourth decoder
175 selector
18 error state measuring unit
19 encoding system selecting unit
191 encoding system selection information
192 decoding system selection information
30 error correction encoding unit
31 modulator
32 demodulator
33 error correction decoding unit
1010 variable encoding unit
1105 selector
1017 variable decoding unit
1175 selector

DESCRIPTION OF THE PREFERRED EMBODIMENT

Hereinafter, an embodiment of the invention will be described with reference to the drawings.

The exemplary embodiment of the invention is an error correcting device for 32-kbps ADPCM data in a radio system. FIG. 1 shows the system configuration of the embodiment. The reference number 10 designates a variable encoding unit, 11 and 16 designate packet handlers, 12 and 15 designate modulators, 13 and 14 designate demodulators, 17 designates a variable decoding unit, 18 designates an error state measuring unit, and 19 designates an encoding system selecting unit.

The variable encoding unit 10 comprises a first encoder 101, a second encoder 12, a third encoder 103, a fourth encoder 104, and a selector 105.

The variable decoding unit 17 comprises a first decoder 171, a second decoder 172, a third decoder 173, a fourth decoder 174, and a selector 175. The operation of this error correcting device for 32-kbps ADPCM data is described below.

The variable encoding unit 10 receives 40 samples of ADPCM data in which one sample consists of 4 bits, i.e., 160 bits of ADPCM data as one block. In the ADPCM data, among 4 bits constituting one sample, higher-order bits have a more important meaning. Consequently, the encoders 101 to 104 conduct error correction encoding on data of one block in the following manner.

The first encoder 101 conducts block encoding in which all the data, or 160 bits are treated as objects to be encoded, and adds 15 check bits. The second encoder 102 conducts block encoding in which the high-order 3 bits of each sample, or 120 bits are treated as objects to be encoded, and adds 15 check bits. The third encoder 103 conducts block encoding in which the high-order 2 bits of each sample, or 80 bits are treated as objects to be encoded, and adds 15 check bits. The fourth encoder 104 conducts block encoding in which the most significant bit of each sample, or 40 bits are treated as objects to be encoded, and adds 15 check bits.

Figure 2:
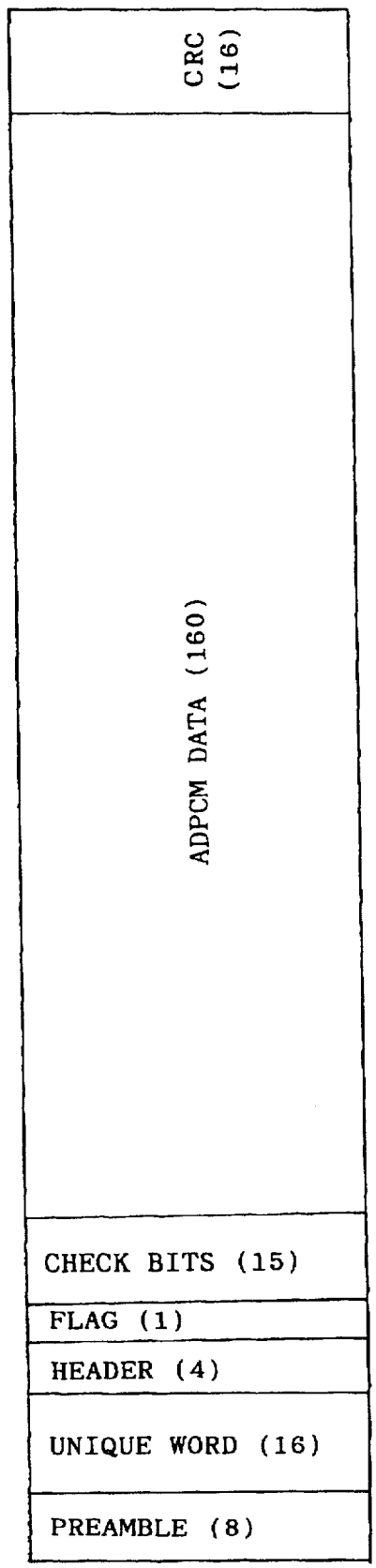
FIG. 2 is a diagram showing a packet format.

The selector 105 selects one of the outputs of the encoders 101 to 104 and outputs the selected output. The packet handler 11 adds to the selected output a preamble for attaining bit synchronization, a unique word for attaining frame synchronization, a CRC for error detection, and a header and flag indicative of the attribute of a packet, and assembles a packet having the format shown in FIG. 2. The packet is modulated by the modulator 12 and then transmitted.

The demodulator 14 receives the data. The data are then divided by the packet handler 16 into ADPCM data and control data. The ADPCM data are supplied to the variable decoding unit 17.

The decoders 171 to 174 conduct calculations respectively corresponding to the encoders 101 to 104 to correct errors. In accordance with decoding system selection information 192, the selector 175 selects one of the outputs of the decoders 171 to 174, and outputs the selected output.

The communication channel error state measuring unit 18 receives the CRC from the packet handler 16, conducts error detection on the blocks using CRC, and always monitors the ratio of the number of erroneous blocks to the total number of blocks during a predetermined period.

The encoding system selecting unit 19 evaluates the ratios on 4 levels against predetermined criteria, and outputs the evaluation result as encoding system selection information 191 and the decoding system selection information 192. When the state of the communication channel is most excellent, the first encoder 101 and the first decoder 171 are selected. Similarly, the second encoder 102 and the second decoder 172, the third encoder 103 and the third decoder 173, and the fourth encoder 104 and the fourth decoder 174 are selected in order of reducing communication channel state.

The encoding system selection information 191 is sent to the modulator 15 via the packet handler 16 to be modulated thereby, and then transmitted. The data are received by the demodulator 13. The packet handler 11 separates the encoding system selection information 191 from the received data, and provides it to the selector 105. The selector 105 operates in accordance with the encoding system selection information 191.

The decoding system selection information 192 is provided to the selector 175.

Figure 3:
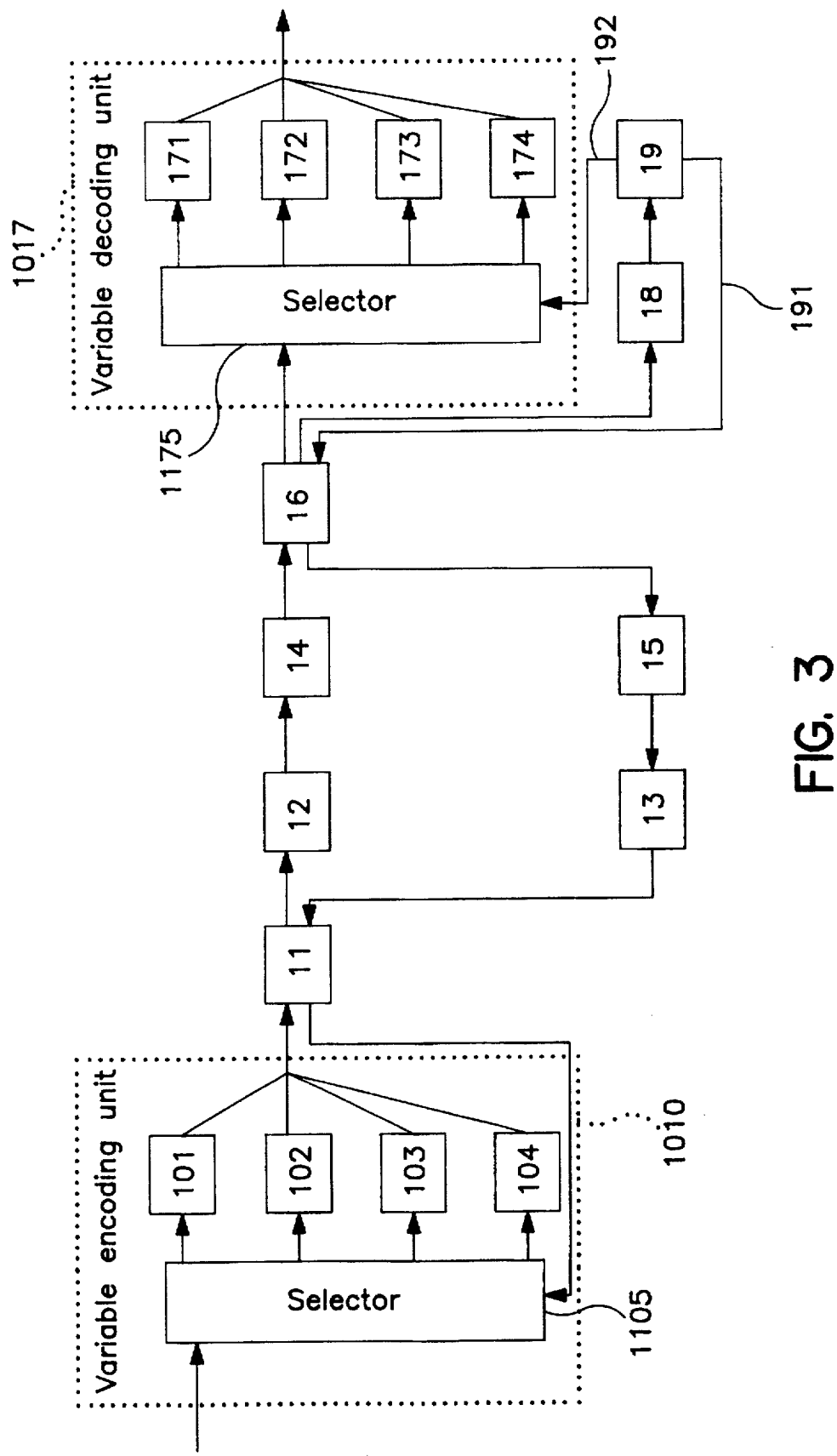
FIG. 3 is a block diagram showing the configuration of another embodiment of the invention.
Figure 4:
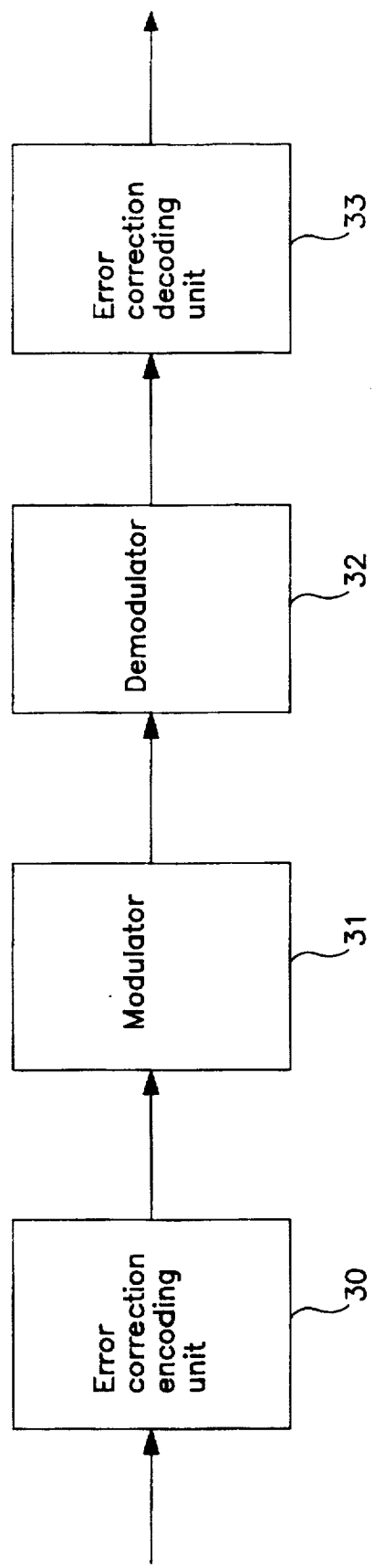
FIG. 4 is a block diagram showing the configuration of a prior art correcting device.

FIG. 3 shows the system configuration of another embodiment of the present invention. The reference number 1010 designates a variable encoding unit, 11 and 16 designate packet handlers, 12 and 15 designate modulators, 13 and 14 designate demodulators, 1017 designates a variable decoding unit, 18 designates an error state measuring unit, and 19 designates an encoding system selecting unit.

The variable encoding unit 10 comprises a first encoder 101, a second encoder 102, a third encoder 103, a fourth encoder 104, and a selector 1105. The variable decoding unit 1017 comprises a first decoder 171, a second decoder 172, a third decoder 173, a fourth decoder 174, and a selector 1175. This embodiment is different from the above mentioned embodiment as set forth below.

The selector 1105 selects one of a plurality of encoders 101-104 on a basis of encoding system selection information 191, and the selected one of the encoders 101-104 conducts encoding on an arbitrary number of data in one of the blocks into which voice and/or image data are divided. Each block has a predetermined number of data.

Furthermore, the selector 1175 selects one of a plurality of decoders 171-174 on a basis of decoding system selection information 192 determined by the encoding system selecting unit 19, and the selected one of the decoders 171-174 conducts decoding on output data from packet handlers 16.

As described above, the communication channel error state measuring unit 18 measures the state of the communication channel. In accordance with the measurement result, as the error state becomes worse, the encoding system selecting unit 19 limits the number of bits of ADPCM data to higher-order bits having more important information, and error correction encoding is then conducted only on the higher-order bits.

Even when the error state is inferior, therefore, it is possible to obtain an excellent sound quality in which degradation is lower in magnitude than that obtained in a prior art error correcting device, while maintaining a constant information transmission efficiency.

In the first embodiment, a CRC is used in the measurement of the error state of the communication channel. Alternatively, the number of error bits may be a unique word in a packet.

In the first embodiment, a CRC is used in the measurement of the error state of the communication channel. Alternatively, the demodulator 14 may measure the received signal strength, and the measured field may be used for that purpose.

In the first embodiment, a combination of a selector 105 and a selector 175 is used. In the second embodiment, a combination of a selector 1105 and a selector 1175 is used. A combination of a selector 105 and a selector 1175 can also be used or a combination of a selector 1105 and a selector 175 can also be used.

As seen from the above description, according to the invention, the device of the invention includes a first unit which divides the voice or image data into blocks each consisting of a predetermined number of data, selects one of plural error correction encoding systems, and conducts encoding on an arbitrary number of data in one block. A second unit measures an error state of a communication channel and a third unit determines data which are to be subjected to encoding conducted in the first unit, and an error correction encoding system. Consequently, when the state of a communication channel is inferior, data of more importance can be protected, and, when the state is excellent, a wide range of data including those of low importance can be protected. In accordance with environmental variation of the communication channel, therefore, it is possible to obtain a sound or picture quality of reduced degradation, while maintaining a constant information transmission efficiency.

What is claimed is:

1. An error correcting device comprising:
   a first unit which (1) selects one of a plurality of error correction encoding systems on a basis of control information, and (2) conducts encoding using the selected error correction encoding system on of data, said data included in one of a plurality of blocks into which voice and/or image data are divided, each one of the plurality of blocks having a predetermined number of data, each of the error correction encoding systems producing encoded data including a same number of redundancy check bits;
   a second unit which measures an error state of a communication channel; and
   a third unit which (1) determines data which are to be subjected to encoding in said first unit, and (2) an error correction encoding system,
   said second unit supplying information of the measured error state to said third unit,
   said third unit (1) determining (a) data which are to be subjected to encoding, and (b) the error correction encoding system, using the error state information, and (2) supplying the determination to said first unit as said control information.

2. An error correction device according to claim 1, wherein:
   said each block has a plurality of samples, each sample having a plurality of bits, and
   said first unit (1) receives data including at least one of the plurality of samples, (2) selects at least one specific bit from the bits constituting said each sample, and (3) conducts error correction encoding.

3. An error correcting device according to claim 2, wherein:
   said at least one specific bit is selected in accordance with said control information.

4. An error correcting device according to claim 3, wherein:
   when the error state of the communication channel is inferior to a predetermined reference, a number of the specific bits selected in the sample is decreased in accordance with said control information, and
   when the error state of the communication channel is superior to a predetermined reference, the number of the specific bits in the sample is increased in accordance with said control information.

5. An error correcting device according to claim 1, wherein the first unit produces output data and the error correcting device further comprises:

a fourth unit which has a plurality of error correction decoding systems each one of which corresponds to a respective one of said plurality of error correction encoding systems, said fourth unit (1) selects one of the plurality of error correction decoding systems which corresponds to said error correction encoding system determined by said third unit, and (2) conducts decoding using the selected error correction encoding system on the output data from said first unit.

6. An error correcting device according to claim 1, wherein the first unit produces output data and the error correcting device further comprises:

a fourth unit which has a plurality of error correction decoding systems each one of which corresponds to a respective one of said plurality of error correction encoding systems, said fourth unit (1) conducts decoding using said plurality of error correction decoding systems respectively on the output data from said first unit, and (2) selects a certain decoded data corresponding to a certain error correction decoding system corresponding to said error correction encoding system determined by said third unit, from said decoded data.

7. An error correcting device according to claim 1, wherein the first unit encodes one of (a) all of the data and (b) a portion of the data.

8. An error correcting device comprising:

a first unit which (1) conducts encoding using a plurality of error correction encoding systems respectively on data, said data included in one of a plurality of blocks into which voice and/or image data are divided, each one of the blocks having a predetermined number of data, and (2) selects a certain encoded data corresponding to a certain error correction encoding system from the encoded data, on a basis of control information;

a second unit which measures an error state of a communication channel; and a third unit which determines (1) data which are to be subjected to encoding in said first unit, and (2) an error correction encoding system, said second unit supplying information of the measured error state to said third unit, said third unit (1) determining (a) the data which are to be subjected to encoding, and (b) the error correction encoding system, using the error state information, and (2) supplying the determination to said first unit as said control information.

9. An error correcting device according to claim 8, wherein:

said each block has a plurality of samples, each sample having a plurality of bits, and said first unit (1) receives data having at least a plurality of samples, (2) selects at least one specific bit from the bits constituting said each sample, and (3) conducts error correction encoding.

10. An error correcting device according to claim 9, wherein:

said at least one specific bit is selected in accordance with said control information.

11. An error correcting device according to claim 10, wherein:

when the error state of the communication channel is inferior to a predetermined reference, a number of the specific bits selected in the sample is decreased in accordance with said control information, and when the error state of the communication channel is superior to a predetermined reference, the number of the specific bits in the sample is increased in accordance with said control information.

12. An error correcting device according to claim 8, wherein the first unit produces output data and the error correcting device further comprises:

a fourth unit which has a plurality of error correction decoding systems each one of which corresponds to a respective one of said plurality of error correction encoding systems, said fourth unit (1) selects one of the plurality of error correction decoding systems which corresponds to said error correction encoding system determined by said third unit, and (2) conducts decoding using the selected error correction encoding systems on the output data from said first unit.

13. An error correcting device according to claim 8, wherein the first unit produces output data and the error correcting device further comprises:

a fourth unit which has a plurality of error correction decoding systems each one of which corresponds to a respective one of said plurality of error correction encoding systems, said fourth unit (1) conducts decoding using said plurality or error correction decoding systems respectively on the output data from said first unit, and (2) selects a certain decoded data corresponding to a certain error correction decoding system corresponding to said error correction encoding system determined by said third unit, from said decoded data.

14. An error correcting device according to claim 8, wherein the first unit encodes one of (a) all of the data and (b) a portion of the data.

15. An error correcting device comprising:

a first unit which (1) divides voice and/or image data into blocks, (2) selects one of a plurality of error correction encoding systems, and (3) conducts encoding data in one of the blocks, each of the error correction encoding systems producing encoded data including a same number of redundancy check bits;

a second unit which measures an error state of a communication channel; and a third unit which determines (1) data which are to be subjected to encoding conducted in said first unit, and (2) an error correction encoding system, said second unit supplying information of the measured error state to said third unit, said third unit (1) determining (a) the data which are to be subjected to encoding, and (b) the error correction encoding system, using the error state information, and (2) supplying the determination to said first unit as the control information.

16. An error correcting device according to claim 15, wherein:

said block has a plurality of samples, each sample having a plurality of bits, and said first unit (1) receives data having at least a plurality of the samples, (2) selects at least one specific bit from the bits constituting said each sample, and (3) conducts error correction encoding.

17. An error correcting device according to claim 16, wherein:

the at least one specific bit is selected in accordance with said control information.

18. An error correcting device according to claim 17, wherein:

when the error state of the communication channel is inferior to a predetermined reference, a number of specific bits selected in the sample is decreased in accordance with said control information, and when the error state of the communication channel is superior to the predetermined reference, the number of the specific bits in the sample is increased in accordance with said control information.

19. An error correcting device according to claim 15, wherein:

said block has a plurality of samples, each sample having a plurality of bits, and said first unit (1) receives data having at least a plurality of the samples, (2) selects at least one specific bit from the bits constituting said each sample, and (3) conducts error correction encoding.

20. An error correcting device according to claim 19, wherein:

said at least one specific bit is selected in accordance with said control information.

21. An error correcting device according to claim 20, wherein:

when the error state of the communication channel is inferior to a predetermined reference, a number of the specific bits selected in the sample is decreased in accordance with said control information, and when the error state of the communication channel is superior to a predetermined reference, the number of the specific bits in the sample is increased in accordance with said control information.

22. An error correcting device according to claim 15, wherein the first unit produces output data and the error correcting device further comprises:

a fourth unit which has a plurality of error correction decoding systems each one of which corresponds to a respective one of said error correction encoding systems, said fourth unit (1) selects one of the plurality of error correction decoding systems which corresponds to the error correction encoding system determined by said third unit, and (2) conducts decoding using the selected error correction decoding system on the output data from said first unit.

23. An error correcting device according to claim 15 wherein the first unit encodes one of (a) all of the data and (b) a portion of the data.

24. An error correcting device comprising:

a first unit which (1) divides voice and/or image data into blocks, (2) selects one of a plurality of error correction encoding systems, (3) conducts encoding on data in one of the blocks, and (4) produces output data;

a second unit which measures an error state of a communication channel;

a third unit which determines (1) data which are to be subjected to encoding conducted in said first unit, and (2) an error correction encoding system;

said second unit supplying information of the measured error state to said third unit;

said third unit (1) determining (a) the data which are to be subjected to encoding, and (b) the error correction encoding system, using the error state information, and (2) supplying the determination to said first unit as the control information; and a fourth unit which has a plurality of error correction decoding systems each one of which corresponds to a respective one of said error correction encoding systems, the fourth unit (1) conducts decoding using said plurality of error correction decoding systems respectively on the output data from said first unit, and (2) selects a certain decoded data corresponding to a certain error correction decoding system corresponding to said error correction encoding system determined by said third unit, from said decoded data.

25. An error correcting device according to claim 24, wherein the first unit encodes one of (a) all of the data and (b) a portion of the data.

* * * * *